Inventor
HAROLD T. LYMAN
by: Ooms, McDougall, Williams & Hersh
Attys.

United States Patent Office 2,961,746
Patented Nov. 29, 1960

2,961,746

PRINTED CIRCUITS

Harold T. Lyman, Milford, Conn., assignor to Aladdin Industries, Incorporated, Nashville, Tenn., a corporation of Illinois Filed June 18, 1956, Ser. No. 592,120

9 Claims. (Cl. 29—155.5)

This invention relates to printed circuits and methods for making such circuits. The invention also pertains to photosensitive resist materials for use in making printed circuits.

One principal object of the present invention is to provide a printed circuit element which embodies a printed circuit having both sides exposed so that electrical connections can readily be made thereto.

A further object is to provide such a new and improved printed circuit element which is self-supporting without the aid of any mechanical backing.

Another object is to provide new and improved methods for making such printed circuits.

Still another object is to provide photosensitive resist materials for use in making such printed circuits.

Further objects and advantages of the present invention will appear from the following description, taken with the accompanying drawings, in which.

Figures 1, 2, 3, 4, 5, 6, 7:
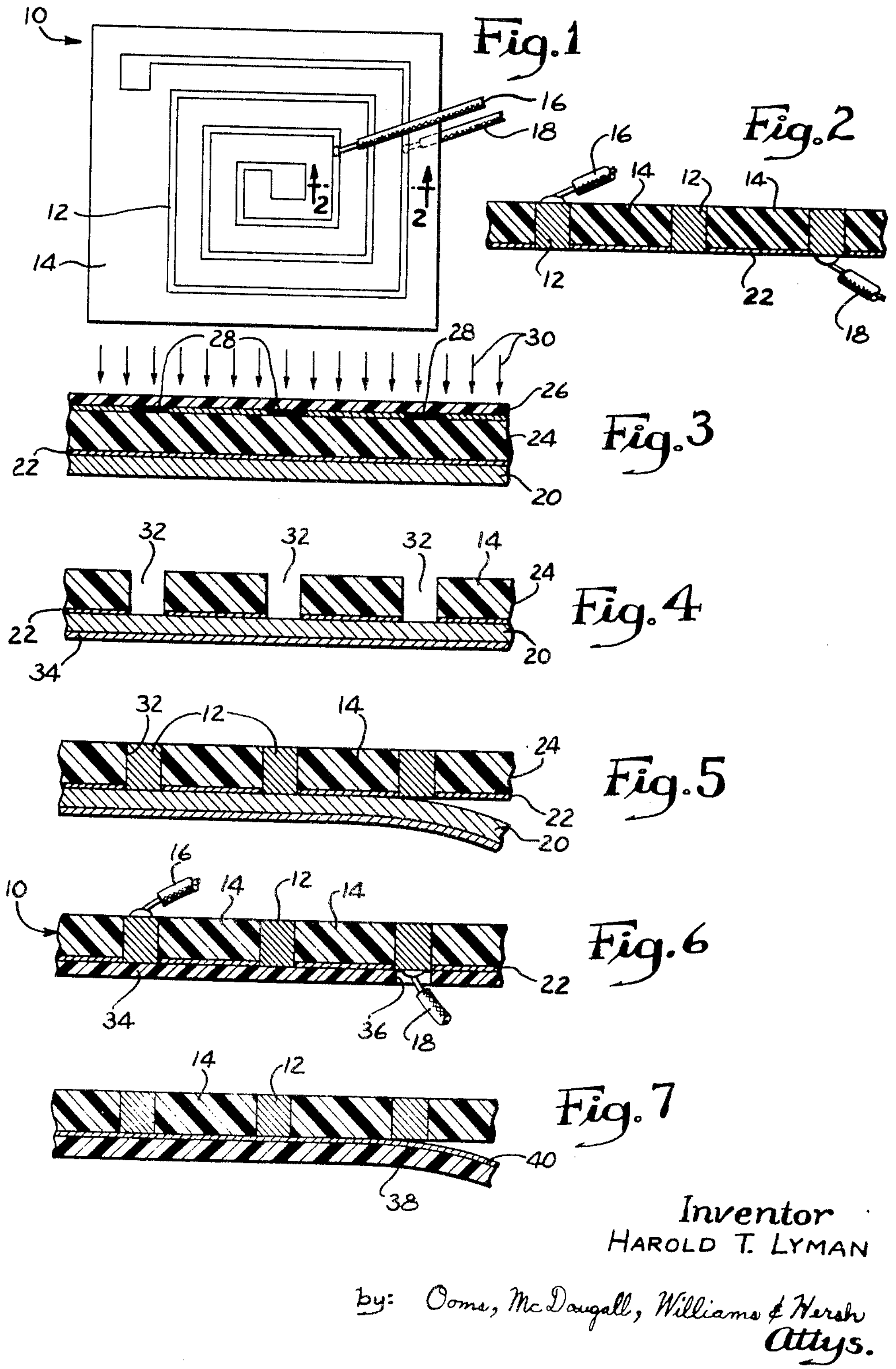
Fig. 1 is a plan view of a printed circuit element constituting an illustrative embodiment of the present invention.
Fig. 2 is an enlarged fragmentary cross-sectional view of the printed circuit element, taken generally along a line 2—2 in Fig. 1.
Figs. 3–5 are cross-sectional views showing successive stages in an exemplary method of making the printed circuit element of Figs. 1 and 2.
Fig. 6 is a cross-sectional view, similar to Fig. 2 but showing a modified printed circuit element.
Fig. 7 is a cross-sectional view illustrating a modified method of making the printed circuit of Figs. 1 and 2.

As already indicated, Figs. 1 and 2 illustrate a printed circuit element or member 10 which is generally plate-like or sheet-like in form and is inherently self-supporting, without the aid of any backing. The illustrated printed circuit member 10 comprises a conductive, metal portion 12 and an insulating portion 14. The metal portion 12 occupies a portion of each face of the member 10 and extends entirely through the plate-like member. Thus, the metal portion 12 is exposed and accessible on both sides. Accordingly, leads 16 and 18 or other conductors may readily be soldered or otherwise connected to the opposite sides of the metal portion 12.

The insulating portion 14 of the printed circuit member 10 occupies those portions of the member 10 which are not occupied by the metal portion 12. Thus, the insulating portion 14 provides mechanical support for the metal portion 12 so that the member 10 will be self-supporting. The insulating portion 14 is adherent to the metal portion 12.

For the purposes of the present invention, the metal portion 12 may assume a variety of shapes. It may be virtually any shape that might be desired in a conductive circuit element. For the purpose of illustration, the metal portion 12 is shown as a flat, generally spiral-shaped coil. The illustrative leads 16 and 18 are soldered to spaced points on the coil 12. The insulating portion 14 of the printed circuit member 10 fills the spaces between the turns of the coil 12 so that the entire unit is self-supporting.

Figs. 3–5 illustrate one exemplary method of making the printed circuit element 10. In this method a thin, flexible conductive sheet or plate 20 is employed as a temporary backing during several stages of the method. The temporary backing sheet 20 is preferably made of a material from which it will be relatively easy to strip the finished printed circuit unit 10. One suitable material is stainless steel or some similar metal, as illustrated in Figs. 3–5.

In accordance with the method of Figs. 3–5, a cement coating 22 is preferably applied to one side of the conductive backing sheet 20. The coating 22 may be made of ordinary pressure sensitive cement, or any other suitable cement providing a relatively light bond to facilitate the eventual stripping of the temporary backing 20. It is possible to dispense with the cement coating 22, although the use of the coating is preferred.

A thicker coating 24 of photosensitive resist material is applied over the cement coating 22. The coating 24 is made of a material which is a good electrical insulator and dielectric. Such resist coating materials are quite well-known in the art. Various suitable materials may be employed. One suitable material is composed essentially of styrene monomer with the addition of a photosensitizer in the form of phenosafranin dye. The amount of the dye employed is not particularly critical. One suitable amount is .02 percent of the dye.

In preparing the resist coating, the styrene monomer is preferably washed with a 3 percent caustic solution to remove any inhibitors that might tend to prevent polymerization of the styrene. The styrene is then rinsed in water to remove the caustic solution. The concentration of the caustic solution is not critical for the purposes of the present invention.

The resist coating 24 may be cast on the supporting surface and then cured by the application of moderate heat. For example, the resist coating 24 may be cured for about six hours at about 180° F. The curing time and temperature are not particularly critical.

Various other photosensitive resist materials may be employed in the coating 24. It is possible to use Kodak Photo Resist in the resist coating 24. This is a commercial material sold by the Eastman Kodak Company, of Rochester, New York. Another suitable material is a mixture of Kodak Photo Resist and styrene monomer. The proportions of the mixture may vary considerably. Thus, the constituents may be in equal portions, or the Kodak Photo Resist may be employed in a smaller proportion, such as 25 percent. A small amount of photosensitizing dye, such as phenosafranin, may be added to the mixture, if desired. Thus, .01 percent of phenosafranin dye may be added to the mixture of equal parts of styrene monomer and Kodak Photo Resist. The various alternative materials may be applied and cured in the manner already described.

Next, the photosensitive resist coating 24 is exposed to light in an image area that eventually will become the insulating portion 14 of the printed circuit unit 10. As shown in Fig. 3, a photographic negative or transparency 26 may be employed to expose the image area while leaving the non-image area unexposed. The negative 26 has opaque elements 28 which mask the non-image area. It is prefered to employ ultra-violet radiation or other highly actinic radiation. The radiation is indicated by arrows 30 in Fig. 3.

Where the resist coating 24 is exposed to light, it is hardened and thus rendered relatively insoluble in various solvents that otherwise would readily dissolve the coating. It is believed that this hardening action is due to polymerization of the resist coating 24.

It has been found that extremely long exposure to ultraviolet radiation will have a reverse or softening effect in the exposed areas. When advantage is taken of this softening effect, the image and non-image areas are reversed in making the exposure. Generally, however, it is preferred to take advantage of the hardening effect that results from a smaller amount of exposure to actinic radiation.

The next step is to dissolve away the portion of the resist coating 24 that has not been exposed to light, leaving the hardened portion. This step is illustrated in Fig. 4. The remaining portion of the resist coating 24 becomes the insulating portion 14 of the eventual printed circuit unit 10. Thus, the remaining portion is indicated by the reference character 14 in Fig. 4. Voids 32 are left where the resist coating 24 is dissolved away. The portion of the cement coating 22 underlying the unhardened portion of the resist coating 24 is also dissolved away, leaving the bare surface of the temporary backing 20.

When the resist coating 24 is any of the compositions described above, the unhardened portion may be dissolved away with various organic solvents, such as toluene or xylene, for example. The Kodak Photo Resist may be dissolved away with Kodak Photo Resist Developer, a commercial solvent sold for this purpose by Eastman Kodak Company.

As already indicated, it is possible to form the insulating portion 14 in a single series of steps comprising the application, exposure and solvent development of the resist coating. If an especially thick final insulating member 14 is desired, it is possible to go through two or more cycles of application, exposure and development of the coating. In that case, each successive layer of the coating is laid over the preceding layer.

Once the insulating portion 14 has been formed, the voids 32 are filled with metal to form the metal portion 12. Various procedures may be employed in filling the voids 32 with metal. Thus, for example, the voids 32 may be filled with molten metal of a low melting point. However, it is preferred to fill the voids 32 by electroplating onto the temporary conductive backing sheet 20. During such electroplating, the reverse side of the sheet 20 is preferably covered with an insulating coating 34 of varnish, lacquer or the like to prevent the depositing of metal thereon. Fig. 5 illustrates the voids 32 filled with metal to define the metal portion 12. It is preferred to deposit a metal which is different from and non-adherent to the temporary backing 20. When the backing 20 is of stainless steel, the electroplated metal may be copper or silver, for example.

Next, the temporary backing sheet 20 is stripped away, as illustrated in Fig. 5. The cement coating 22 facilitates the stripping of the backing sheet 20 from the insulating portion 14 of the printed circuit unit 10. The stainless steel sheet 20 may readily be stripped from the electroplating 12.

If any small fragments or particles of the temporary backing 20 adhere to the insulating member 14 or the metal member 12, they may be removed by subjecting the printed circuit unit 10 to an etching agent capable of dissolving the material of the backing sheet 20. For example, the etching agent may be ferric chloride or a suitable acid. The printed circuit unit 10 is subjected to the etching agent for a limited time, sufficient to remove all traces of the temporary base material and any fringes or burrs on the metal member 12, but not sufficient to dissolve any substantial portion of the metal member 12.

The completed printed circuit unit 10 has sufficient mechanical integrity to be self-supporting, without the aid of any backing. Both sides of the metal member 12 are exposed, so that it is a simple matter to solder or otherwise connect leads thereto. Thus, it is unnecessary to mount eyelets or rivets in the printed circuit member to carry electrical connections therethrough as is often done in conventional practice. The metal member 12 adheres to the insulating member 14 so that the printed circuit unit 10 has considerable mechanical strength.

If additional mechanical strength and rigidity are desired, the printed circuit unit 10 may be mounted on a permanent insulating backing sheet 34, which may be cemented, heat-sealed or otherwise secured to one side of the printed circuit unit 10. Thus, the residual cement from the coating 22 may be employed to establish a bond between the printed circuit unit 10 and the permanent backing 34. As shown in Fig. 6, an aperture 36 is formed in the permanent backing to admit the lead 18. Any number of additional apertures may be formed in the permanent backing to expose any desired portions of the metal member 12. These apertures may be formed in the backing before it is mounted on the printed circuit unit 10. In this way, it is easy to solder or otherwise connect leads to any desired points on either face of the printed circuit unit 10.

Fig. 7 illustrates a slightly modified method in which the stainless steel temporary backing sheet 20 is replaced with a non-metallic temporary backing sheet 38, which may be made of an insulating material such as plastic, paper, or the like. A conductive coating 40 is applied to one side of the backing sheet 38 so that metal may be electroplated thereon in the manner already described. The coating 40 may be made of graphite, carbon black or the like. Such materials have the advantage of being easy to strip from both the metal and insulating members 12 and 14.

By providing a two-sided printed circuit, the cost of making connections to the circuit is greatly reduced. Moreover, the two-sided printed circuit is extremely flexible and versatile in use.

Various modifications, alternative constructions and equivalents may be employed without departing from the true spirit and scope of the invention, as exemplified in the foregoing description and defined in the following claims.

I claim:

1. In a method of making a printed circuit, the operations comprising the provision of a thin flexible conductive backing plate of stainless steel, applying a thin cement coating of pressure sensitive cement to one side of said backing plate, applying a resist coating of photosensitive material hardenable by exposure to light over said cement coating, exposing an image area of said resist coating in a predetermined pattern to light while leaving the remaining non-image area unexposed, said resist coating thereby being hardened in said image area, applying a solvent to said resist coating and thereby dissolving away said resist coating and said cement coating in said non-image area, voids thereby being left in said resist coating and said cement coating in said non-image area, electroplating metal onto said plate and thereby filling said voids with said metal, said metal being of a material different from and substantially non-adherent to stainless steel, peeling said backing plate away from said resist coating and said metal in said voids while leaving said metal and said coating intact in adherent relation to each other, and subjecting said peeled resist coating and metal to an etching agent for a limited time to remove any stainless steel remaining adherent to said resist coating and said metal without removing any substantial portion of said metal.

2. In a method of making a printed circuit, the operations comprising the provision of a thin flexible conductive backing plate of stainless steel, applying a thin cement coating of pressure sensitive cement to one side of said backing plate, applying a resist coating of photosensitive material hardenable by exposure to light over said cement coating, exposing an image area of said resist coating in a predetermined pattern to light while leaving the remaining non-image area unexposed, said resist coating thereby being hardened in said image area, applying a solvent to said resist coating and thereby dissolving away said resist coating and said cement coating in said non-image area, voids thereby being left in said resist coating and said cement coating in said non-image area, electroplating metal onto said plate and thereby filling said voids with said metal, said metal being of a material different from and substantially non-adherent to stainless steel, peeling said backing plate away from said resist coating and said metal in said voids while leaving said metal and said coating intact in adherent relation to each other, providing a permanent backing sheet of insulating material, forming an aperture in said sheet, and mounting said resist coating and metal on said sheet, said aperture being located so as to expose a portion of said metal and afford access for making electrical connection thereto.

3. In a method of making a printed circuit, the operations comprising the provision of a thin flexible conductive backing plate of stainless steel, applying a thin cement coating of pressure sensitive cement to one side of said backing plate, applying a resist coating of photosensitive material hardenable by exposure to light over said cement coating, exposing an image area of said resist coating in a predetermined pattern to light while leaving the remaining non-image area unexposed, said resist coating thereby being hardened in said image area, applying a solvent to said resist coating and thereby dissolving away said resist coating and said cement coating in said non-image area, voids thereby being left in said resist coating and said cement coating in said non-image area, electroplating metal onto said plate and thereby filling said voids with said metal, said metal being of a material different from and substantially non-adherent to stainless steel, peeling said backing plate away from said resist coating and said metal in said voids while leaving said metal and said coating intact in adherent relation to each other, and soldering leads to said metal on both sides thereof.

4. In a method of making a flat self-supporting plate-like printed circuit, the operations comprising the provision of a temporary conductive backing sheet, applying a photosensitive resist coating to one side of said sheet, exposing said coating to light in an image area while leaving the remaining non-image area unexposed, subjecting said coating to a solvent to dissolve away said coating in one of said areas and leave voids therein while leaving said coating intact in the other of said areas, electroplating metal onto said temporary backing sheet and thereby filling said voids with metal, peeling said temporary backing sheet from said coating and said metal while leaving said metal and said coating intact in adherent relation to each other, said coating and said metal thereafter constituting a printed circuit plate with said metal exposed on both sides thereof throughout the extent of said metal, subjecting said printed circuit plate to an etching agent and thereby removing any portion of said temporary backing sheet adhering to said printed circuit plate without removing any substantial portion of said metal, connecting a first lead to said metal on one side of said plate and a second lead to said metal on the opposite side of said plate, and mounting a permanent insulating backing sheet against said one side of said plate with an aperture in said permanent backing sheet for admitting said first lead.

5. In a method of making a flat self-supported plate-like printed circuit, the operation comprising the provision of a temporary backing sheet with at least one side conductive, applying a photosensitive resist coating to said one side of said sheet, exposing said coating to actinic radiation in an image area while leaving the remaining non-image area unexposed, subjecting said coating to a solvent to dissolve away said coating in one of said areas and leave voids therein while leaving said coating substantially intact in the other of said areas, electroplating metal onto said temporary backing sheet and thereby filling said voids with metal, and peeling said temporary backing sheet from said coating and said metal while leaving said metal and said coating intact in adherent relation to each other, said peeled coating and metal constituting a printed circuit plate with said metal exposed on both sides thereof throughout the extent of said metal.

6. In a method of making a flat self-supporting plate-like printed circuit, the operation comprising the provision of a temporary backing sheet with at least one side conductive, applying a photosensitive resist coating to said one side of said sheet, exposing said coating to actinic radiation in an image area while leaving the remaining non-image area unexposed, subjecting said coating to a solvent to dissolve away said coating in one of said areas and leave voids therein while leaving said coating substantially intact in the other of said areas, electroplating metal onto said temporary backing sheet and thereby filling said voids with metal, peeling said temporary backing sheet from said coating and said metal while leaving said coating and said metal intact in adherent relation to each other, said peeled coating and metal constituting a printed circuit plate with said metal exposed on both sides thereof throughout the extent of said metal, providing a permanent insulating backing sheet, forming aperture means therein, and mounting said permanent backing sheet against one side of said printed circuit plate with said aperture means aligned with and exposing a portion of said metal.

7. In a method of making a flat self-supporting plate-like printed circuit, the operation comprising the provision of a temporary backing sheet, applying a photosensitive resist coating to one side of said sheet, exposing said coating to actinic radiation in an image area while leaving the remaining non-image area unexposed, subjecting said coating to a solvent to dissolve away said coating in one of said areas and leave voids therein while leaving said coating intact in the other of said areas, filling said voids with metal, and peeling said temporary backing sheet from said coating and said metal while leaving said metal and said coating intact in adherent relation to each other, said peeled coating and metal constituting a printed circuit plate with said metal exposed on both sides thereof throughout the extent of said metal.

8. In a method of making a flat self-supporting plate-like printed circuit, the operation comprising the provision of a temporary conductive backing sheet, applying a photosensitive resist coating to one side of said sheet exposing said coating to light in an image area while leaving the remaining non-image area unexposed, subjecting said coating to a solvent to dissolve away said coating in one of said areas and leave voids therein while leaving said coating intact in the other of said areas, electroplating metal onto said temporary backing sheet and thereby filling said voids with metal, peeling said temporary backing sheet from said coating and said metal while leaving said metal and said coating intact in adherent relation to each other, said peeled coating and said metal constituting a printed circuit plate with said metal exposed on both sides thereof throughout the extent of said metal, and subjecting said printed circuit plate to an etching agent and thereby removing any portion of said temporary backing sheet adhering to said printed circuit plate without removing any substantial portion of said metal.

9. In a method of making a printed circuit, the operations comprising the provision of a thin flexible conductive backing sheet, applying a thin cement coating to one side of said backing sheet, applying a resist coating of photosensitive material hardenable by exposure to light over said cement coating, exposing an image area of said resist coating in a predetermined pattern to light while leaving the remaining non-image area unexposed, said resist coating thereby being hardened in said image area, applying a solvent to said resist coating and thereby dissolving away said resist coating and said cement coating in said non-image area, voids thereby being left in said resist coating and said cement coating in said non-image area, electroplating metal onto said sheet and thereby filling said voids with said metal, said metal being substantially non-adherent to said backing sheet, peeling said backing sheet away from said resist coating and said metal while leaving said metal and said coating intact in adherent relation to each other, and subjecting said peeled resist coating and metal to an etching agent for a limited time to remove any fragments of said backing sheet remaining adherent to said resist coating and said metal without removing any substantial portion of said metal.

References Cited in the file of this patent

UNITED STATES PATENTS

| | | |
|---|---|---|
| 1,563,731 | Ducas | Dec. 1, 1925 |
| 2,478,274 | Johnson | Aug. 9, 1949 |
| 2,593,479 | Nieter | Apr. 22, 1912 |
| 2,649,513 | Luhn | Aug. 18, 1953 |
| 2,692,190 | Pritikin | Oct. 19, 1954 |
| 2,695,351 | Beck | Nov. 23, 1954 |
| 2,739,881 | Kepple | Mar. 27, 1956 |
| 2,602,731 | Nierenberg | July 8, 1956 |

FOREIGN PATENTS

| | | |
|---|---|---|
| 583,285 | Great Britain | Dec. 13, 1946 |

OTHER REFERENCES

Abstract of an application filed by Stanley C. Mader, February 16, 1950. The abstract published in the Official Gazette, vol. 647, page 655, June 12, 1951.